(12) United States Patent  (10) Patent No.: US 7,768,347 B2
De Cremoux  (45) Date of Patent: Aug. 3, 2010

(54) DEVICE COMPRISING A SWITCHING AMPLIFIER AND A LOAD

(75) Inventor: Guillaume De Cremoux, Edinburgh (GB)

(73) Assignee: NXP B.V., Eindhoven (NL)

( * ) Notice: Subject to any disclaimer, the term of this patent is extended or adjusted under 35 U.S.C. 154(b) by 74 days.

(21) Appl. No.: 11/910,851

(22) PCT Filed: Apr. 3, 2006

(86) PCT No.: PCT/IB2006/051006

§ 371 (c)(1),
(2), (4) Date: Jul. 10, 2008

(87) PCT Pub. No.: WO2006/106471

PCT Pub. Date: Oct. 12, 2006

(65) Prior Publication Data

US 2008/0284511 A1  Nov. 20, 2008

(30) Foreign Application Priority Data

Apr. 7, 2005  (EP) .................................. 05102724

(51) Int. Cl.
*H03F 3/217* (2006.01)
(52) U.S. Cl. .................................. 330/251; 330/207 A
(58) Field of Classification Search .................. 330/10, 330/207 A, 251
See application file for complete search history.

(56) References Cited

U.S. PATENT DOCUMENTS

| 3,919,656 | A | * | 11/1975 | Sokal et al. ................... 330/51 |
| 5,663,647 | A |  | 9/1997 | Wirth et al. |
| 6,097,249 | A |  | 8/2000 | Strickland et al. |
| 6,175,272 | B1 | * | 1/2001 | Takita ......................... 330/10 |
| 6,211,728 | B1 |  | 4/2001 | Chen et al. |
| 6,535,058 | B1 | * | 3/2003 | Kirn ........................... 330/10 |
| 6,593,807 | B2 |  | 7/2003 | Groves et al. |
| 7,330,069 | B2 | * | 2/2008 | Yamamura et al. ............ 330/10 |
| 2008/0129377 | A1 | * | 6/2008 | You et al. ..................... 330/10 |
| 2009/0153242 | A1 | * | 6/2009 | Cygan et al. .................. 330/10 |

OTHER PUBLICATIONS

Karsten Nielsen, Parallel Phase Shifted Carrier Pulse Width Modulation (PSCPWM)—A novel approach to switching power amplifier design, Mar. 22, 1997, p. 1-26, Bang & Olufsen, Denmark and Institute of Automation, Technical Universtiy of Denmark.

* cited by examiner

*Primary Examiner*—Steven J Mottola

(57) ABSTRACT

Devices comprising switching amplifiers such as class D amplifiers and comprising loads such as loud speakers are provided with controllers for controlling switching circuits for in respective four states introducing respective four voltage signals across the loads, which four voltage signals are different from each other. The controllers control the switching circuits for pulse width modulating the voltage signals in dependence of input signals and control the switching circuits for in fifth states introducing fifth voltage signals across the loads.

10 Claims, 4 Drawing Sheets

DEVICE COMPRISING A SWITCHING AMPLIFIER AND A LOAD

The invention relates to a device comprising a switching amplifier and a load, and also relates to a switching amplifier, to a controller for use in a switching amplifier, to a switching circuit for use in a switching amplifier, to a switching amplifying method and to a switching amplifying processor program product.

Examples of such a device are mobile phones and other audio devices, and examples of such a switching amplifier are class D amplifiers.

A prior art switching amplifier is known from U.S. Pat. No. 6,211,728 B1, which discloses a filter less switching amplifier comprising a control circuit for controlling four switches. A first switch couples a first side of a load to a voltage supply, a second switch couples the first side of the load to ground, a third switch couples a second side of the load to the voltage supply, and a fourth switch couples the second side of the load to ground. By, according to a first option, making the first and fourth switches conductive, a first voltage signal is introduced across the load. By, according to a second option, making the second and third switches conductive, a second voltage signal is introduced across the load, which second voltage signal is equal to the inverted first voltage signal. By, according to a third option, making either the first and the third or the second and the fourth switches conductive, the load is short circuited.

For a positive input signal, the control circuit switches from the third option to the first option and vice versa, according to a pulse width modulation technology (smaller absolute value input signal=smaller pulses=shorter conductive time interval during the first option and longer conductive time interval during the third option; larger absolute value input signal=longer pulses=longer conductive time interval during the first option and shorter conductive time interval during the third option). For a negative input signal, the control circuit switches from the third option to the second option and vice versa, according to the pulse width modulation technology (smaller absolute value input signal=shorter pulses=shorter conductive time interval during the second option and longer conductive time interval during the third option; larger absolute value input signal=longer pulses=longer conductive time interval during the second option and shorter conductive time interval during the third option).

An average value of the voltage signal across the load corresponds with an amplified input signal. Compared to switching from the first option to the second option and vice versa, in other words compared to using the first and second option only, the introduction of the third option allows to avoid filters in the form of serial inductors and parallel capacitors at both sides of the load, because the switching power in the high frequency domain is reduced.

The known device is disadvantageous, inter alia, owing to the fact that the switching power in the high frequency domain is still relatively high. This switching power in the high frequency domain is dissipated in the load such as for example a loud speaker and may damage this loudspeaker.

It is an object of the invention, inter alia, to provide a device comprising a switching amplifier and a load, in which switching amplifier the switching power in the high frequency domain is relatively low.

Further objects of the invention are, inter alia, to provide a switching amplifier, and to provide a controller, a switching circuit, a switching amplifying method and a switching amplifying processor program product for use in (combination with) a switching amplifier, in which the switching power in the high frequency domain is relatively low.

The device according to the invention comprises a switching amplifier and a load, the switching amplifier comprising a controller for controlling a switching circuit for in respective first and second and third and fourth states introducing respective first and second and third and fourth voltage signals across the load, which first and second and third and fourth voltage signals are different from each other.

By introducing at least four states and at least four different voltage signals across the load (four or more options), the switching power in the high frequency domain is reduced, compared to using three states and three different voltage signals across the load only (three options only). This can be derived as follows.

In the prior art two-option situation, the voltage signal across the load changes for example from a plus voltage supply value to a minus voltage supply value and vice versa. In case of a 1 Watt input signal, for example 5 Watt switching power is generated and to be filtered by the filters in the form of the serial inductors and the parallel capacitors. In the prior art three-option situation, the voltage signal across the load changes for example from a zero value to a plus voltage supply value and vice versa or from a zero value to a minus voltage supply value and vice versa. In case of a 1 Watt input signal, then for example 1.5 Watt switching power is generated and dissipated in the load. The reason for this is that the voltage swings have been reduced during a switching event. For a positive input signal, it is no longer necessary to use the second option, and for a negative input signal, it is no longer necessary to use the first option. Therefore, when introducing at least four states and at least four different voltage signals across the load, the voltage swings are further reduced, and the switching power is further reduced.

The device according to the invention is further advantageous, inter alia, in that the total power consumption is reduced, which results in a longer playing time per battery.

An embodiment of the device according to the invention is defined by the controller being arranged to control the switching circuit for pulse width modulating the voltage signals in dependence of an input signal. The use of a pulse width modulation technology functions well in the device according to the invention.

An embodiment of the device according to the invention is defined by the controller being arranged to control the switching circuit for in a fifth state introducing a fifth voltage signal across the load, which fifth voltage signal is different from the first and second and third and fourth voltage signals. The introduction of the fifth state and the fifth voltage signal across the load will further reduce the switching power and the dissipation in the load and the power consumption and will further increase the playing time per battery.

An embodiment of the device according to the invention is defined by the first voltage signal having a positive first value, the second voltage signal having a negative first value, the third voltage signal having a positive second value, the fourth voltage signal having a negative second value, and the fifth voltage signal having a third value, which first and second and third values are different from each other. The fifth state is for example a short circuited state and then corresponds with the prior art third option.

An embodiment of the device according to the invention is defined by the respective positive and negative second values being at least 25% and at most 75% of the respective positive and negative first values and the third value being at least minus 25% and at most plus 25% of the positive first value. Preferably, the respective positive and negative second values will be about 50% of the respective positive and negative first values and the third value will be about zero, to get a minimal switching power dissipation in the load. In case of a 1 Watt input signal, then for example 0.2 Watt switching power is generated and dissipated in the load. The total power consumption of the switching amplifier of 1.0+0.2=1.2 Watt results in a more than doubled playing time per battery compared to the prior art three-option situation having a total power consumption of the switching amplifier of 1.0+1.5=2.5 Watt.

An embodiment of the device according to the invention is defined by the switching circuit comprising three respective switches for coupling a side of the load to three respective voltage terminals and further comprising three respective further switches for coupling a further side of the load to the three respective voltage terminals. The three switches for example comprise a first switch coupled to a first voltage supply for introducing the voltage signal having a positive first value, a second switch coupled to a second voltage supply for introducing the voltage signal having a positive second value and a third switch coupled to ground for introducing the voltage signal having a third value. The three further switches for example comprise a further first switch coupled to the first voltage supply for introducing the voltage signal having a negative first value, a further second switch coupled to the second voltage supply for introducing the voltage signal having a negative second value and a further third switch coupled to ground for introducing the voltage signal having a third value.

An embodiment of the device according to the invention is defined by the switching amplifier being a class D amplifier. A class D amplifier is an amplifier that does not reproduce a linear signal such as a class AB amplifier but that reproduces a digital power signal having a duty cycle which is proportional to an amplitude of the input signal. The use of a class D amplifier functions well in the device according to the invention.

Embodiments of the switching amplifier according to the invention and of the controller according to the invention and of the switching circuit according to the invention and of the switching amplifying method according to the invention and of the switching amplifying processor program product according to the invention correspond with the embodiments of the device according to the invention.

The invention is based upon an insight, inter alia, that reduced voltage swings reduce the switching power, and is based upon a basic idea, inter alia, that at least four different states for introducing at least four different voltage signals across the load are to be used.

The invention solves the problem, inter alia, to provide a device comprising a switching amplifier and a load, in which switching amplifier the switching power in the high frequency domain is relatively low, and is further advantageous, inter alia, in that the total power consumption is reduced, which results in a longer playing time per battery.

These and other aspects of the invention will be apparent from and elucidated with reference to the embodiments(s) described hereinafter.

Figure 1:
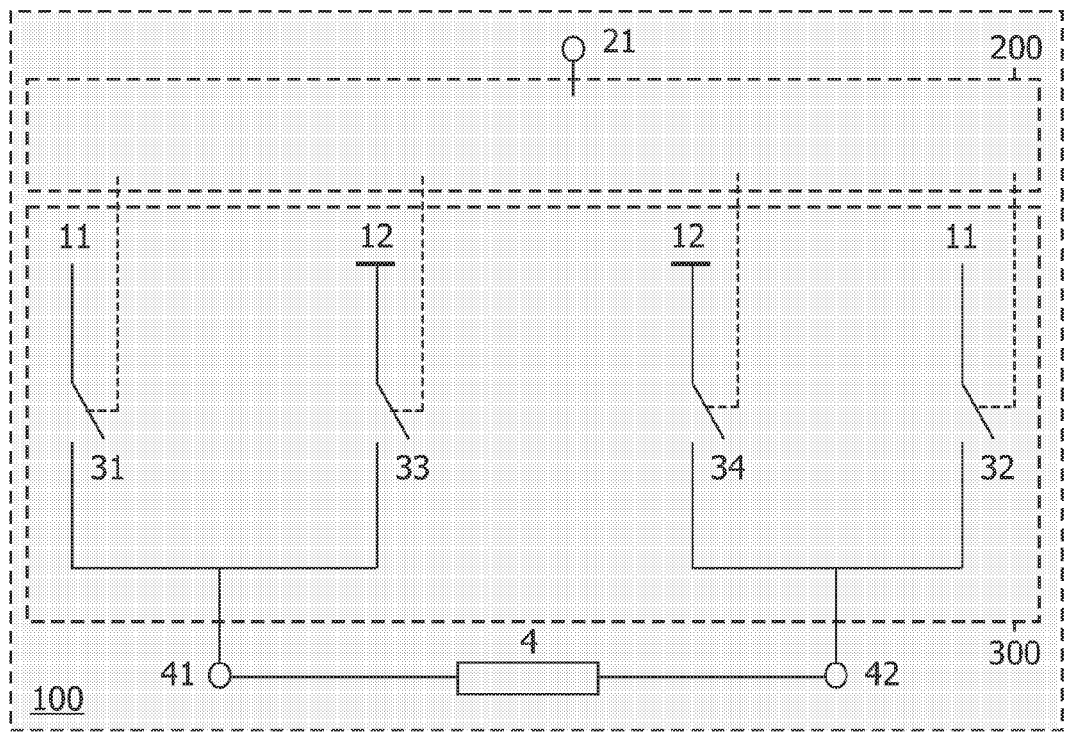
FIG. 1 shows diagrammatically a prior art device comprising a prior art switching amplifier.

The prior art device 100 shown in FIG. 1 comprises a prior art switching amplifier 200,300 and a load 4. The prior art switching amplifier 200,300 comprises a controller 200 and a switching amplifier 300. The switching amplifier 300 comprises four switches 31-34. The switch 31 is coupled to a voltage supply 11 and to a first side 41 of the load 4. The switch 33 is coupled to a ground 12 and to the first side 41 of the load 4. The switch 32 is coupled to the voltage supply 11 and to a second side 42 of the load 4. The switch 34 is coupled to the ground 12 and to the second side 42 of the load 4. All switches 31-34 are controlled by the controller 200, which comprises an input 21 for receiving an input signal to be amplified.

Figure 2:
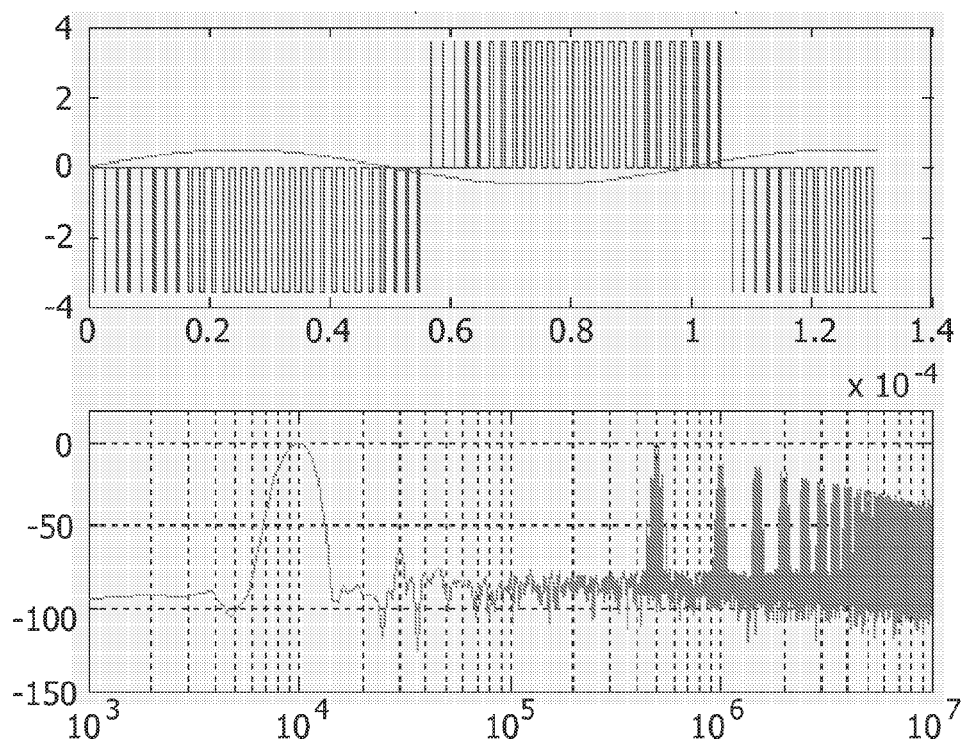
FIG. 2 shows a timing diagram and a frequency diagram for the prior art switching amplifier.

The timing diagram and the frequency diagram shown in FIG. 2 for the prior art switching amplifier 200,300 shown in FIG. 1 illustrate the performance of the prior art switching amplifier 200,300 (upper curve: x-axis: time; y-axis: magnitude in Volts; lower curve: x-axis: frequency; y-axis: power of the signal in dB). By, according to a first option, making the switches 31 and 34 conductive, a voltage signal Uopt1-41-42 is introduced across the load 4. This voltage signal Uopt1-41-42 is substantially equal to the voltage value of the voltage supply 11. By, according to a second option, making the switches 33 and 32 conductive, a voltage signal Uopt2-41-42 is introduced across the load 4. This voltage signal Uopt2-41-42 is equal to the inverted voltage signal Uopt1-41-42. In other words, Uopt2-41-42=minus Uopt1-41-42. By, according to a third option, making either the switches 31 and 32 or the switches 33 and 34 conductive, the load 4 is short circuited, and a voltage signal Uopt3-41-42 equal to zero is introduced across the load 4. In other words, Vopt3-41-42=0 Volt.

For a positive input signal, the controller 200 switches from the third option to the first option and vice versa, according to a pulse width modulation technology (smaller absolute value input signal=shorter pulses=shorter conductive time interval during the first option and longer conductive time interval during the third option; larger absolute value input signal=longer pulses=longer conductive time interval during the first option and shorter conductive time interval during the third option). For a negative input signal, the controller 200 switches from the third option to the second option and vice versa, according to the pulse width modulation technology (smaller absolute value input signal=shorter pulses=shorter conductive time interval during the second option and longer conductive time interval during the third option; larger absolute value input signal=longer pulses=longer conductive time interval during the second option and shorter conductive time interval during the third option).

An average value of the voltage signal across the load 4 corresponds with an amplified input signal. Compared to switching from the first option to the second option and vice versa, in other words compared to using the first and second options only, the introduction of the third option allows to avoid filters in the form of serial inductors and parallel capacitors at both sides of the load 4, and reduces the switching power in the high frequency domain. This can be derived from the following calculation, assuming that the voltage value of the voltage supply 11 is 4 Volt and that a 1 Watt input signal is supplied. In the prior art two-option situation, the voltage signal across the load 4 changes for example from a plus voltage supply value to a minus voltage supply value and vice versa. Then 5 Watt switching power is generated and to be filtered by the filters in the form of the serial inductors and the parallel capacitors. The total power consumption in the switching amplifier 200,300 is then equal to 1+5=6 Watt. In the prior art three-option situation, the voltage signal across the load 4 changes for example from a zero value to a plus voltage supply value and vice versa or from a zero value to a minus voltage supply value and vice versa. Then 1.5 Watt switching power is generated and dissipated in the load 4. The total power consumption in the switching amplifier 200,300 is then equal to 1.0+1.5=2.5 Watt. The reason for this is that the voltage swings have been reduced. For a positive input signal, it is no longer necessary to use the second option, and for a negative input signal, it is no longer necessary to use the first option. This reduces the power consumption.

The switching power in the high frequency domain of the prior art device 100 is still relatively high. This switching power in the high frequency domain is dissipated in the load 4 such as for example a loud speaker and may damage this loudspeaker. According to the invention, this switching power in the high frequency domain is further reduced, as follows.

Figure 3:
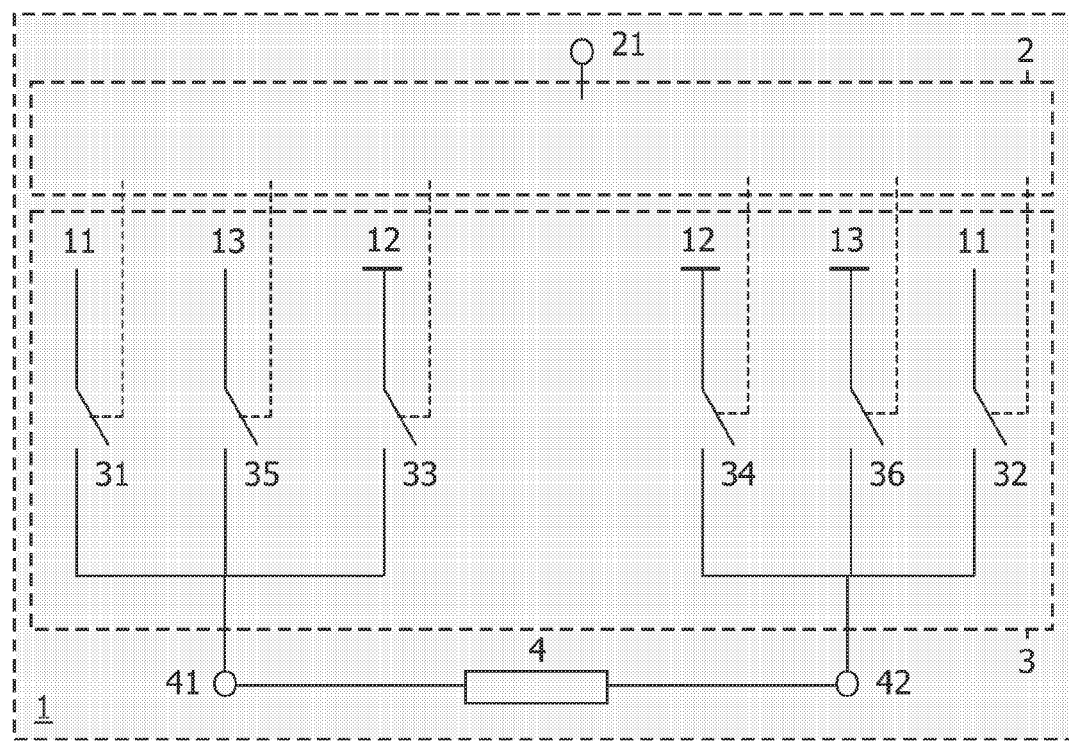
FIG. 3 shows diagrammatically a device according to the invention comprising a switching amplifier according to the invention.

The device 1 according to the invention shown in FIG. 3 comprises a switching amplifier 2,3 according to the invention and a load 4. The switching amplifier 2,3 according to the invention comprises a controller 2 according to the invention and a switching amplifier 3 according to the invention. The switching amplifier 3 comprises six switches 31-36. The switch 31 is coupled to a voltage supply 11 and to a first side 41 of the load 4. The switch 33 is coupled to a ground 12 and to the first side 41 of the load 4. The switch 35 is coupled to a voltage supply 13 and to the first side 41 of the load 4. The switch 32 is coupled to the voltage supply 11 and to a second side 42 of the load 4. The switch 34 is coupled to the ground 12 and to the second side 42 of the load 4. The switch 36 is coupled to the voltage supply 13 and to the second side 42 of the load 4. All switches 31-36 are controlled by the controller 2, which comprises an input 21 for receiving an input signal to be amplified.

Figure 4:
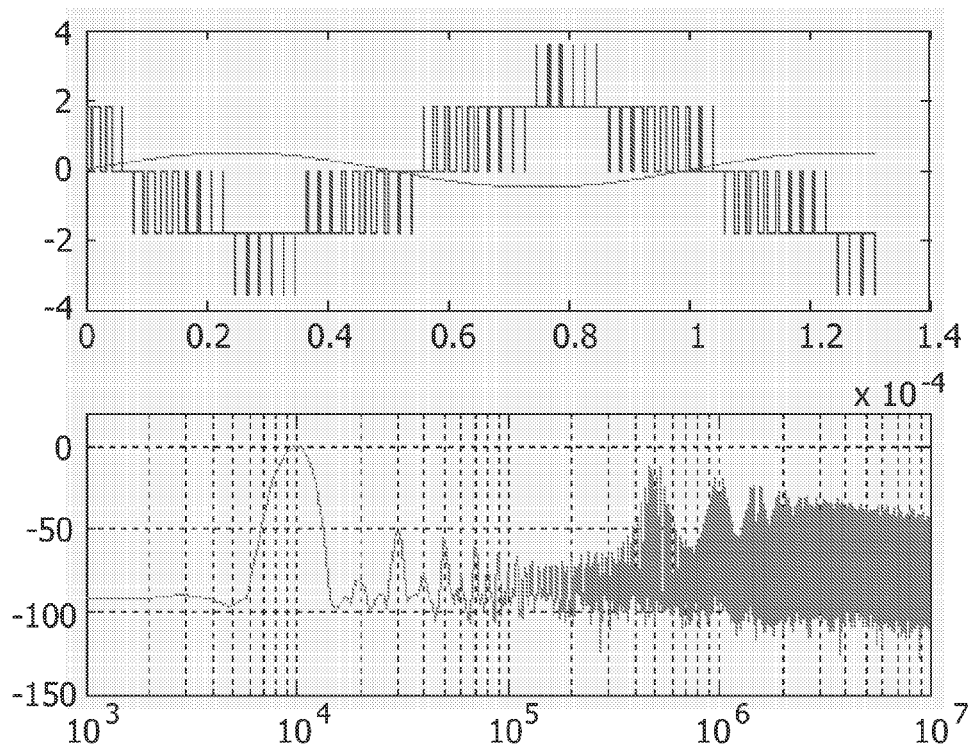
FIG. 4 shows a timing diagram and a frequency diagram for the switching amplifier according to the invention.

The timing diagram and the frequency diagram shown in FIG. 4 for the switching amplifier 2,3 according to the invention shown in FIG. 3 illustrate the performance of the switching amplifier 2,3 according to the invention (upper curve: x-axis: time; y-axis: magnitude in Volts; lower curve: x-axis: frequency; y-axis: power of the signal in dB). In respective first and second and third and fourth and fifth states, respective first and second and third and fourth and fifth voltage signals are introduced across the load 4, which first and second and third and fourth and fifth voltage signals are different from each other. As shown in FIG. 4, the first voltage signal is for example substantially equal to 4 Volt, the second voltage signal is for example substantially equal to minus 4 Volt, the third voltage signal is for example substantially equal to 2 Volt, the fourth voltage signal is for example substantially equal to minus 2 Volt, and the fifth voltage signal is for example substantially equal to 0 Volt.

Again, an average value of the voltage signal across the load 4 corresponds with an amplified input signal. Compared to the prior art three-option situation, the switching power in the high frequency domain is further reduced. This can be derived from the following calculation, assuming that the voltage value of the voltage supply 11 is 4 Volt and that the voltage value of the voltage supply 13 is 2 Volt and that a 1 Watt input signal is supplied. In the five-state situation, as shown in FIG. 4, the voltage signal across the load 4 changes for example from plus 2 Volt to 0 Volt and vice versa, then from 0 Volt to minus 2 Volt and vice versa, then from minus 2 Volt to minus 4 Volt and vice versa, then from minus 2 Volt to 0 Volt and vice versa, then from 0 Volt to plus 2 Volt and vice versa, then from plus 2 Volt to plus 4 Volt and vice versa etc. In this case, only 0.2 Watt switching power is generated and dissipated in the load 4. The total power consumption in the switching amplifier 2,3 is then equal to 1.0+0.2=1.2 Watt. The reason for this is that the voltage swings have been further reduced.

The voltage value of the voltage supply 13 should be at least 25% and at most 75% of the voltage value of the voltage supply 11. The voltage value of the ground 12 should be at least minus 25% and at most plus 25% of the voltage value of the voltage supply 11. Preferably (minimal power consumption), the voltage value of the voltage supply 13 will be about 50% of the voltage value of the voltage supply 11 and the voltage value of the ground 12 will be about zero, to get a minimal switching power dissipation in the load 4.

Preferably, but not exclusively, the switching amplifier 2,3 is a class D amplifier, and the controller 2 is arranged to control the switching circuit 3 for pulse width modulating the voltage signals across the load 4 in dependence of an input signal. The device 1 according to the invention is further advantageous, inter alia, in that the total power consumption is reduced, which results in a longer playing time per battery.

Of course, when introducing at least four states and at least four different voltage signals across the load 4, the voltage swings are already reduced compared to the prior art three-option situation, and the switching power is already reduced. In that case, the voltage value of the voltage supply 13 could be for example 25% to 40% such as for example 33% of the voltage value of the voltage supply 11 to introduce, a) the value of the voltage supply 11, b) plus 33% of this value, c) minus 33% of this value and d) minus this value, across the load 4. Further, although the respective switches 31 and 35 on the one hand and the respective switches 32 and 36 on the other hand are coupled to the respective same voltage supplies 11 and 13, mutually different voltage supplies may be introduced. This under the condition that the controller 2 can control the switching circuit 3 for in respective first and second and third and fourth states introducing respective first and second and third and fourth voltage signals across the load 4, which first and second and third and fourth voltage signals are different from each other. The switching amplifier 2,3 is thereby arranged to switch between each pair of states which introduce neighboring voltage signals. Such voltage signals have neighboring voltage levels.

Figure 5:
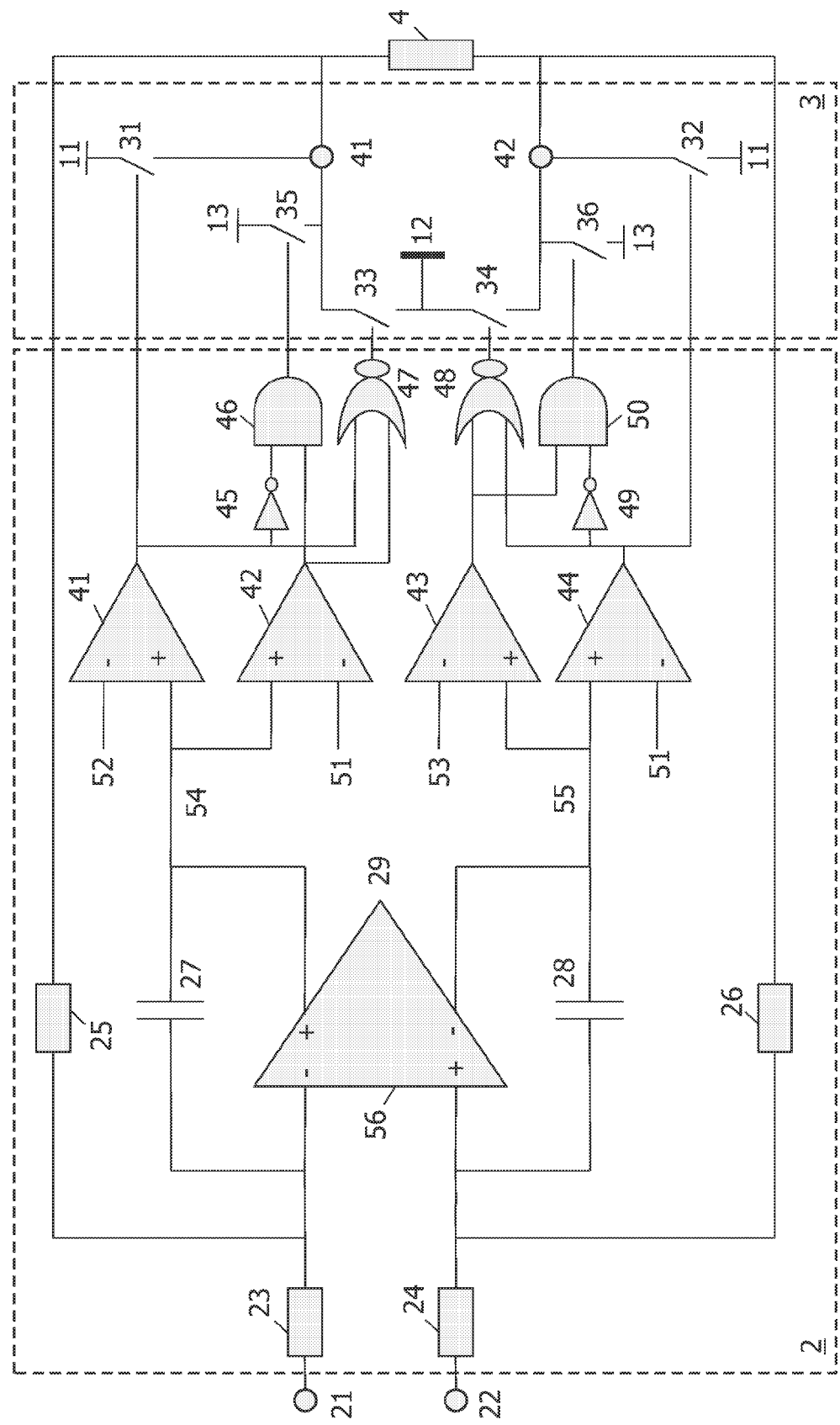
FIG. 5 shows diagrammatically a controller according to the invention and a switching circuit according to the invention for use in the switching amplifier according to the invention in greater detail.

A possible embodiment of the controller 2 according to the invention shown in FIG. 5 comprises the inputs 21 and 22 for receiving differential input signals (same absolute values, different signs). The input 21 is coupled via a resistor 23 to an inverted input of an amplifier 29, and the input 22 is coupled via a resistor 24 to a non-inverted input of the amplifier 29. This amplifier 29 further receives a common mode voltage 56 for centering the input signals around this common mode voltage 56. The inverted input of the amplifier 29 is further coupled via a resistor 25 to the first side 41 of the load 4 and via a capacitor 27 to a non-inverted output of the amplifier 29, and the non-inverted input of the amplifier 29 is further coupled via a resistor 26 to the second side 42 of the load 4 and via a capacitor 28 to an inverted output of the amplifier 29.

Figure 6:
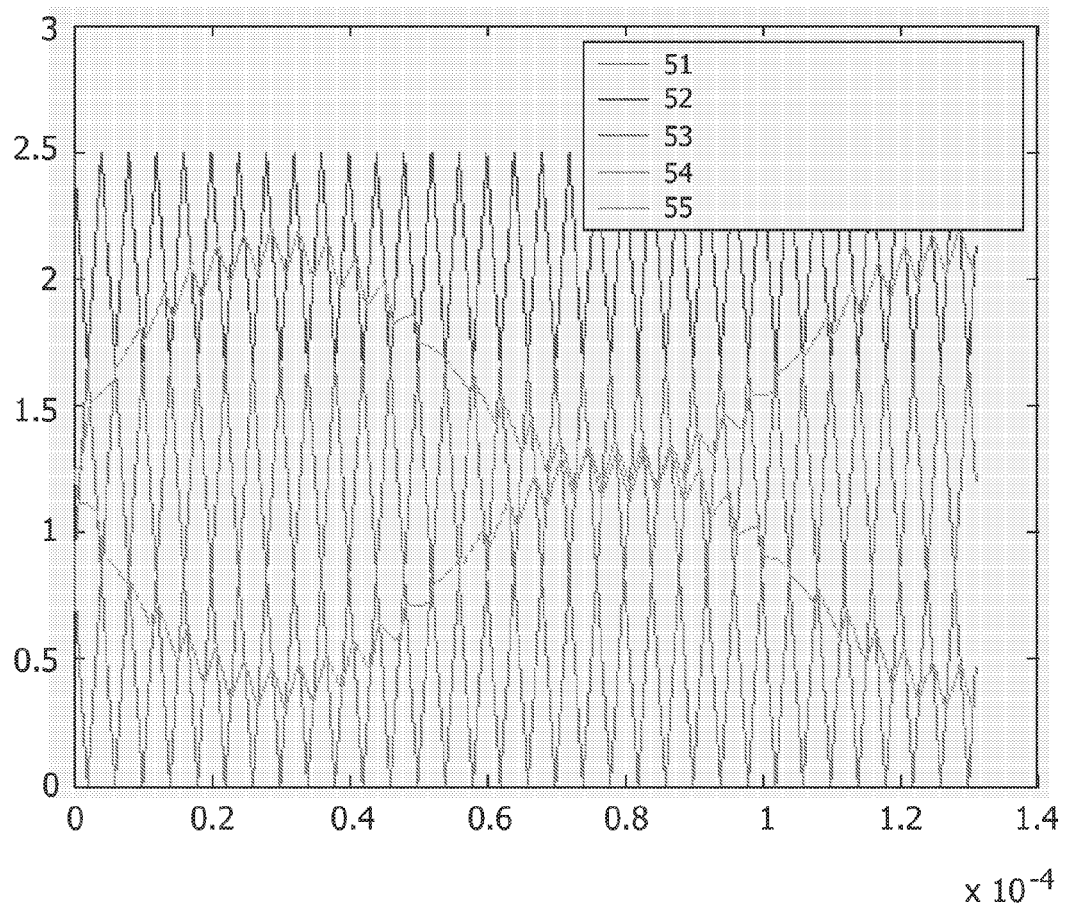
FIG. 6 shows a timing diagram for the controller according to the invention.

At the non-inverted output of the amplifier 29, an output signal 54 is present and supplied to non-inverted inputs of comparators 41 and 42. At the inverted output of the amplifier 29, an output signal 55 is present and supplied to non-inverted inputs of comparators 43 and 44. An inverted input of the comparator 41 receives a saw tooth signal 52, an inverted input of the comparator 43 receives a saw tooth signal 53, and inverted inputs of the comparators 42 and 44 receive a saw tooth signal 51. The signals 51-55 are shown in FIG. 6 (x-axis: time; y-axis: magnitude in Volts).

An output of the comparator 41 controls through a level-shifter and a buffer the switch 31 such as for example a transistor in the switching circuit 3 and is further coupled via an inverter 45 to an input of an AND gate 46 and is further coupled to an input of a NOR gate 47. An output of this AND gate 46 controls the switch 35 such as for example a transistor in the switching circuit 3. An output of the amplifier 42 is coupled to a further input of the AND gate 46 and to a further input of the NOR gate 47. An output of this NOR gate 47 controls through a level-shifter and a buffer the switch 33 such as for example a transistor in the switching circuit 3. An output of the comparator 44 controls through a level-shifter and a buffer the switch 32 such as for example a transistor in the switching circuit 3 and is further coupled via an inverter 49 to an input of an AND gate 50 and is further coupled to an input of a NOR gate 48. An output of this AND gate 50 controls through a level-shifter and a buffer the switch 36 such as for example a transistor in the switching circuit 3. An output of the comparator 43 is coupled to a further input of the AND gate 50 and to a further input of the NOR gate 48. An output of this NOR gate 48 controls through a level-shifter and a buffer the switch 34 such as for example a transistor in the switching circuit 3.

The output signal is a differential output signal. It is sensed through the resistors 25 and 26 and subtracted from the differential input signal that has the opposite polarity. So it is added to the differential input signal that has the same polarity. The error signal that is the combination of the input signal and the output signal is averaged by means of low-pass filters, here active first-order RC integrators built around the amplifier 29 and the capacitors 27 and 28. This allows to average the output pulse width modulation signal contribution, and to extract the needed audio signal from this output pulse width modulation signal. In other words, the outputs of the integrators are the error signals, but within the band of interest (the audio band).

More generally, between the differential inputs 21 and 22 and the differential outputs 41 and 42, there is an analog loop present and comprising the resistors 25 and 26, and there is a digital loop present and comprising amplifiers 29 and comparators 41-44 and the circuitry 45-50 and the switches 31-36. Many alternatives of both loops may be introduced.

The differential integrator outputs are compared to a set of three internal signals 52 (saw tooth up), 51 (saw tooth) and 53 (saw tooth down), as explained below. The results of the comparisons are combined and used to drive the switches 31-36. The switch drivers are basic switch drivers, and comprise level shifters and high-speed gate drivers. The switches are usually NMOS and PMOS. For the case of PMOS, whose driving signal must have a reverse polarity, an additional inverter must be inserted in the driving path.

The switches 31-36 connect the sides 41 and 42 of the load either to the voltage supply 11 or 13 or to the ground 12. The signals 51, 52 and 53 are three saw tooth that are generated internally. For an output switching period of Tpwm, the period of these saw tooth is 2*Tpwm. All three have a same frequency and have a constant phase that does not need to be matched with each other. In FIG. 6, the timing diagram of these saw tooth is plotted along with the outputs of the integrators. These outputs show the averaged pulse width modulation signal (yet with a small ripple, because the integrators were not able to remove all the switching power, this can however easily be improved by using more sophisticated filters and/or integrators).

The invention may be used in all handsets in the market, as modern mobile phones feature stereo audio applications at a large output power. This invention offers to the customers at the expenses of at most one coil (for deriving the voltage supply 13 from the voltage supply 11 by means of for example a DCDC converter) an audio amplifier that works with any loudspeaker, that consumes twice less than prior art amplifiers, and that dissipates six times less in the loudspeaker than the filter less class D of the competition.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. Device comprising a switching amplifier and a load, the switching amplifier comprising a controller for controlling a switching circuit for in respective first and second and third and fourth states introducing respective first and second and third and fourth voltage signals across the load, which first and second and third and fourth voltage signals are different from each other, the controller being arranged to control the switching circuit for in a fifth state introducing a fifth voltage signal across the load, which fifth voltage signal is different from the first and second and third and fourth voltage signals, the first voltage signal having a positive first value, the second voltage signal having a negative first value, the third voltage signal having a positive second value, the fourth voltage signal having a negative second value, and the fifth voltage signal having a third value, which first and second and third values are different from each other.

2. Device according to claim 1, the controller being arranged to control the switching circuit for pulse width modulating the voltage signals in dependence of an input signal.

3. Device according to claim 1, the respective positive and negative second values being at least 25% and at most 75% of the respective positive and negative first values and the third value being at least −25% and at most 25% of the positive first value.

4. Device according to claim 1, the switching circuit comprising three respective switches for coupling a side of the load to three respective voltage terminals and further comprising three respective further switches for coupling a further side of the load to the three respective voltage terminals.

5. Device according to claim 1, the switching amplifier being a class D amplifier.

6. Switching amplifier comprising a controller for controlling a switching circuit for in respective first and second and third and fourth states introducing respective first and second and third and fourth voltage signals across a load, which first and second and third and fourth voltage signals are different from each other, the first voltage signal having a positive first value, the second voltage signal having a negative first value, the third voltage signal having a positive second value, the fourth voltage signal having a negative second value, which first and second values are different from each other.

7. Controller for use in a switching amplifier comprising the controller for controlling a switching circuit for in respective first and second and third and fourth states introducing respective first and second and third and fourth voltage signals across a load, which first and second and third and fourth voltage signals are different from each other, the controller being arranged to control the switching circuit for in a fifth state introducing a fifth voltage signal across the load, which fifth voltage signal is different from the first and second and third and fourth voltage signals, the first voltage signal having a positive first value, the second voltage signal having a negative first value, the third voltage signal having a positive second value, the fourth voltage signal having a negative second value, and the fifth voltage signal having a third value, which first and second and third values are different from each other.

8. Switching circuit for use in a switching amplifier comprising a controller for controlling the switching circuit for in respective first and second and third and fourth states introducing respective first and second and third and fourth voltage signals across a load, which first and second and third and fourth voltage signals are different from each other, the first voltage signal having a positive first value, the second voltage signal having a negative first value, the third voltage signal having a positive second value, the fourth voltage signal having a negative second value, which first and second values are different from each other.

9. Switching amplifying method comprising the step of controlling a switching circuit for in respective first and second and third and fourth and fifth states introducing respective first and second and third and fourth and fifth voltage signals across the load, which first and second and third and fourth and fifth voltage signals are different from each other, the first voltage signal having a positive first value, the second voltage signal having a negative first value, the third voltage signal having a positive second value, the fourth voltage signal having a negative second value, and the fifth voltage signal having a third value, which first and second and third values are different from each other.

10. Switching amplifying processor program product comprising the function of controlling a switching circuit for in respective first and second and third and fourth and fifth states introducing respective first and second and third and fourth and fifth voltage signals across the load, which first and second and third and fourth and fifth voltage signals are different from each other, the first voltage signal having a positive first value, the second voltage signal having a negative first value, the third voltage signal having a positive second value, the fourth voltage signal having a negative second value, and the fifth voltage signal having a third value, which first and second and third values are different from each other.

* * * * *